(12) United States Patent
Liu et al.

(10) Patent No.: US 11,587,917 B2
(45) Date of Patent: Feb. 21, 2023

(54) BACKLIGHT MODULE, DISPLAY PANEL AND ELECTRONIC DEVICE

(71) Applicant: TCL CHINA STAR OPTOELECTRONICS TECHNOLOGY CO., LTD., Guangdong (CN)

(72) Inventors: Quansheng Liu, Guangdong (CN); Hongyuan Xu, Guangdong (CN); Xin Zhang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 85 days.

(21) Appl. No.: 16/975,440

(22) PCT Filed: May 20, 2020

(86) PCT No.: PCT/CN2020/091245
§ 371 (c)(1),
(2) Date: Aug. 25, 2020

(87) PCT Pub. No.: WO2021/223268
PCT Pub. Date: Nov. 11, 2021

(65) Prior Publication Data
US 2021/0351170 A1 Nov. 11, 2021

(30) Foreign Application Priority Data
May 6, 2020 (CN) .......................... 202010374379.8

(51) Int. Cl.
*H01L 25/16* (2006.01)
*G02F 1/13357* (2006.01)
(Continued)

(52) U.S. Cl.
CPC ...... *H01L 25/167* (2013.01); *G02F 1/133603* (2013.01); *G02F 1/133612* (2021.01); *H01L 27/124* (2013.01); *H01L 27/1255* (2013.01)

(58) Field of Classification Search
CPC ............... H01L 25/167; H01L 27/3244; H01L 27/3276
See application file for complete search history.

(56) References Cited

U.S. PATENT DOCUMENTS

2001/0020705 A1* 9/2001 Miyata ................ H01L 25/0753
257/113
2012/0153293 A1* 6/2012 Koyama ............. H01L 27/3248
257/E29.273
(Continued)

FOREIGN PATENT DOCUMENTS

CN 107742636 A 2/2018
CN 108267891 A 7/2018
(Continued)

Primary Examiner — Andrew J Coughlin
(74) Attorney, Agent, or Firm — PV IP PC; Wei Te Chung; Ude Lu

(57) ABSTRACT

The present application provides a backlight module, a display panel and an electronic device, including a substrate; a plurality of driving units, formed on the glass substrate; and a plurality of mini-LEDs, each of which includes a first electrode and a second electrode, wherein the driving unit includes a switching module, a driving module and a storing module, one end of the switching module is connected to the driving module and the storing module, the driving module is connected to the mini-LED.

20 Claims, 5 Drawing Sheets

(51) Int. Cl.
   *G02F 1/1335*   (2006.01)
   *H01L 27/12*    (2006.01)

(56) References Cited

U.S. PATENT DOCUMENTS

2016/0351092 A1* 12/2016 Chen .................... G09G 3/3233
2018/0188606 A1    7/2018 Lee et al.
2019/0172761 A1*  6/2019 Guo ........................ H01L 22/22
2020/0043400 A1*  2/2020 Chen .................. H01L 25/0753

FOREIGN PATENT DOCUMENTS

| CN | 109407406 A | 3/2019 |
| CN | 109449259 A | 3/2019 |
| CN | 109585520 A | 4/2019 |
| CN | 110783361 A | 2/2020 |
| CN | 110930953 A | 3/2020 |
| CN | 111092091 A | 5/2020 |
| CN | 111092092 A | 5/2020 |

* cited by examiner

BACKLIGHT MODULE, DISPLAY PANEL AND ELECTRONIC DEVICE

FIELD OF THE DISCLOSURE

The present application relates to display technologies, and more particularly to a backlight module, a display panel and an electronic device.

DESCRIPTION OF RELATED ARTS

With rapid development of display technologies, micro light-emitting diodes (mini-LEDs) that serve as a backlight technology of liquid crystal displays (LCDs) have been gradually developed. Mini-LEDs refer to LEDs with a package size ranged from 0.1 to 0.2 mm, also known as sub-millimeter light-emitting diodes and mini light-emitting diodes. Because the size of mini-LEDs is about several hundred microns, there is no need to overcome the bottleneck of mass transferring. Their mass production is feasible and it is applicable to serve as backlight of large-scaled display screens. However, active-matrix mini-LEDs (AM mini-LEDs) are generally manufactured on a printed circuit board (PCB) using metal-oxide-semiconductor (MOS) transistors. This will result in a thick LCD backlight module and a high cost.

Technical Problems

The present application provides a backlight module, a display panel and an electronic device, for solving the problem of large thickness and high cost in an existing mini-LED backlight module and display panel.

Technical Solutions

A backlight module includes a glass substrate; a plurality of driving units, formed on the glass substrate, each of the driving units includes a thin-film transistor; and a plurality of mini light-emitting diodes (mini-LEDs), disposed on the glass substrate, each of the mini-LEDs includes a first electrode and a second electrode that are connected to a corresponding driving unit, wherein the driving unit includes a switching module, a driving module and a storing module, one end of the switching module is connected to the driving module and the storing module, the driving module is connected to the mini-LED.

A display panel includes a backlight module including a glass substrate; a plurality of driving units, formed on the glass substrate, each of the driving units includes a thin-film transistor; and a plurality of mini light-emitting diodes (mini-LEDs), disposed on the glass substrate, each of the mini-LEDs includes a first electrode and a second electrode that are connected to a corresponding driving unit, wherein the driving unit includes a switching module, a driving module and a storing module, one end of the switching module is connected to the driving module and the storing module, the driving module is connected to the mini-LED.

An electronic device includes a display panel, which includes a backlight module including a glass substrate; a plurality of driving units, formed on the glass substrate, each of the driving units includes a thin-film transistor; and a plurality of mini light-emitting diodes (mini-LEDs), disposed on the glass substrate, each of the mini-LEDs includes a first electrode and a second electrode that are connected to a corresponding driving unit, wherein the driving unit includes a switching module, a driving module and a storing module, one end of the switching module is connected to the driving module and the storing module, the driving module is connected to the mini-LED.

Beneficial Effects

The beneficial effects of the present application are described as follows. By manufacturing the driving units including the TFTs on the glass substrate to drive the mini-LEDs, the present application can reduce the thickness of a mini-LED backlight module and a display panel and lower the cost.

DESCRIPTION OF EMBODIMENTS OF THE DISCLOSURE

Figure 1:
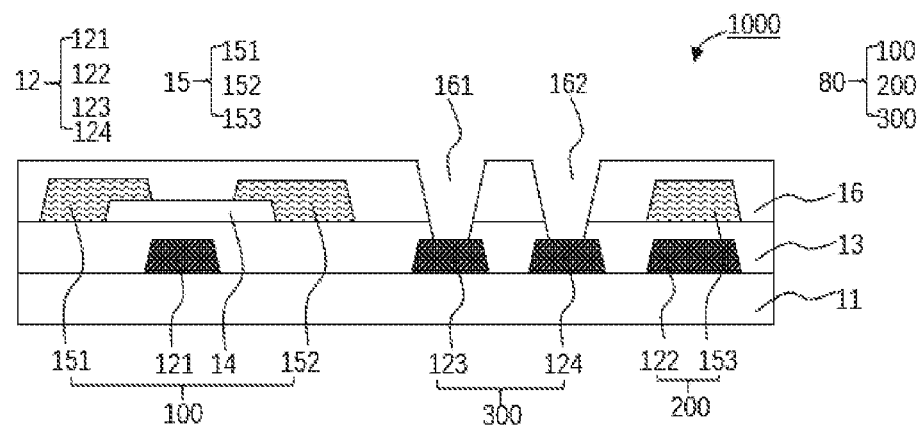
FIG. 1 is a structural schematic diagram illustrating a backlight module according to Embodiment 1 of the present application.

The technical solutions in the embodiments of the present application will be clearly and completely described below with reference to appended drawings of the embodiments of the present application. Obviously, the described embodiments are merely a part of embodiments of the present application and are not all of the embodiments. Based on the embodiments of the present application, all the other embodiments obtained by those of ordinary skill in the art without making any inventive effort are within the scope the present application.

In the description of the present application, it is to be understood that the terms "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicated orientation or positional relationship are based on the relationship of the position or orientation shown in the drawings, which is only for the purpose of facilitating description of the present application and simplifying the description, but is not intended to or implied that the device or element referred to must have a specific orientation, and be constructed and operated in a particular orientation. Therefore, it should not be construed as a limitation of the present application. In addition, the terms "first" and "second" are used for descriptive purposes only, and should not be taken to indicate or imply relative importance, or implicitly indicate the indicated number of technical features. Thus, by defining a feature with "first" or "second", it may explicitly or implicitly include one or more features. In the description of the present application, "a plurality" means two or more unless explicitly defined.

In the description of the present application, it should be noted that unless otherwise explicitly specified or limited, the terms "installed", "connected", and "connection" should be construed broadly, for example, a fixed connection, a removable connection, or integrally connected. These terms may be directed to a mechanical connection, and may also be directed to an electrical connection or communication. Moreover, these terms can be directed to "directly attached", "indirectly connected" through an intermediate medium, and may be directed to "internally communicated" with two components or the "interaction relationship" between two components. For persons skilled in the art, they can understand the specific meaning of the terms in the present application based on specific conditions.

In the present application, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

The following disclosure provides a plurality of different embodiments or examples to implement different structures of this application. To simplify the disclosure of this application, the following describes components and settings in particular examples. Certainly, the examples are merely for illustrative purposes, and are not intended to limit this application. In addition, in this application, reference numerals and/or reference letters may be repeated in different examples. This repetition is for the purpose of simplicity and clarity, and does not in itself indicate a relationship between the various embodiments and/or settings that are discussed. In addition, this application provides examples of various particular processes and materials, but a person of ordinary skill in the art will recognize that other processes and/or materials may be applied and/or used.

Active-matrix mini-LEDs (AM mini-LEDs) are generally manufactured on a printed circuit board (PCB) using metal-oxide-semiconductor (MOS) transistors. This will result in a thick liquid crystal display (LCD) backlight module and a high cost. The present application provides the following technical solutions for solving above technical problem.

Referring to FIGS. 1 to 8, the present application provides a backlight module 1000, including a glass substrate 11; a plurality of driving units 80, formed on the glass substrate 11, each of the driving units 80 includes a thin-film transistor 100; and a plurality of mini light-emitting diodes (mini-LEDs) 20, disposed on the glass substrate 11, each of the mini-LEDs 20 includes a first electrode 21 and a second electrode 22 that are connected to a corresponding driving unit 80, wherein the driving unit 80 includes a switching module 6, a driving module 7 and a storing module 8, one end of the switching module 6 is connected to the driving module 7 and the storing module 8, the driving module 7 is connected to the mini-LED 20.

By manufacturing the driving units 80 including the thin-film transistors (TFTs) 100 on the glass substrate to drive the mini-LEDs, the present application can reduce the thickness of a mini-LED backlight module and a display panel and lower the cost.

The technical solutions of the present application will be described with reference to embodiments as follows.

Embodiment 1

Figure 2:
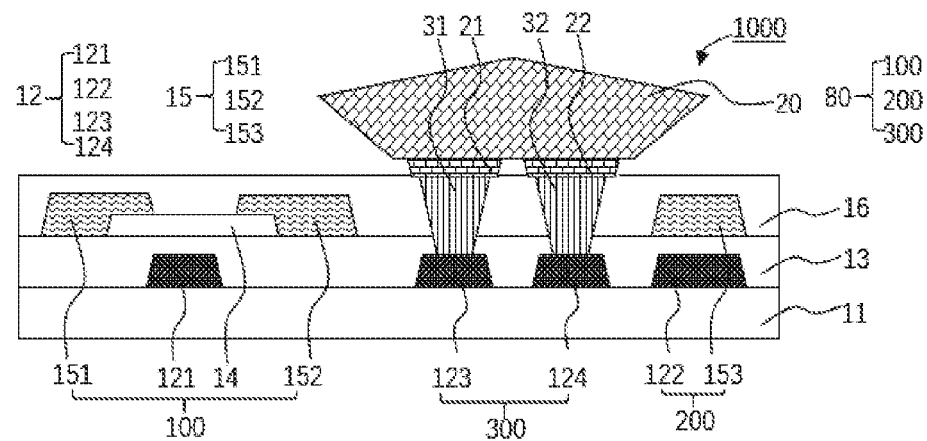
FIG. 2 is a structural schematic diagram illustrating a backlight module according to Embodiment 1 of the present application.

In the present embodiment, referring to FIGS. 1 and 2, a backlight module 1000 includes a glass substrate 11; a plurality of driving units 80, formed on the glass substrate 11, each of the driving units 80 includes a thin-film transistor 100; and a plurality of mini-LEDs 20, disposed on the glass substrate 11, each of the mini-LEDs 20 includes a first electrode 21 and a second electrode 22 that are connected to a corresponding driving unit 80. By manufacturing the driving units 80 including the TFTs 100 on the glass substrate to drive the mini-LEDs, the thickness of a mini-LED backlight module and a display panel can be reduced and the cost is lowered.

Figure 3:
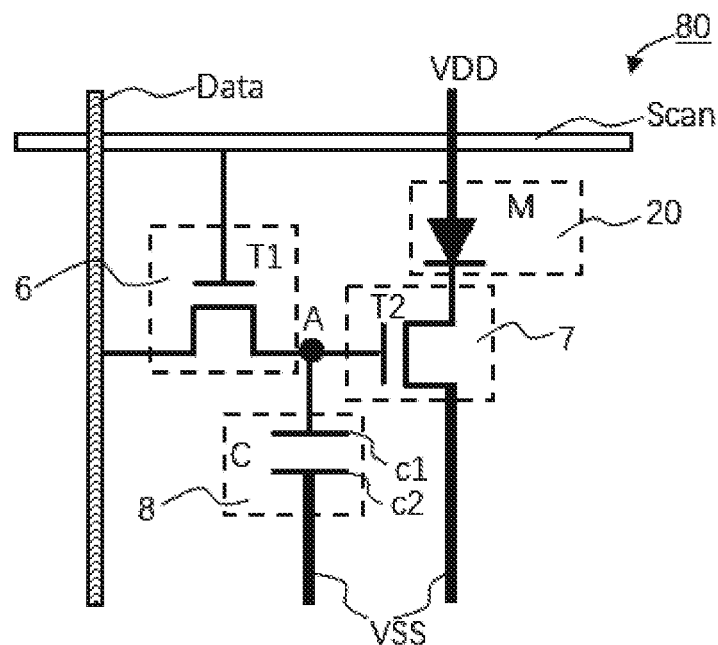
FIG. 3 is a schematic diagram illustrating a circuit structure of a backlight module according to Embodiment 1/2/3/4 of the present application.

In the present embodiment, referring to FIG. 3 which illustrates a circuit structure diagram of the present embodiment, each driving unit 80 includes a switching module 6, a driving module 7 and a storing module 8. One end of the switching module 6 is connected to the driving module and the storing module 8. The driving module 7 is connected to the mini-LED 20. Specifically, each driving unit 80 further includes a VDD signal end and a VSS signal end. The switching module 6 includes a switching thin-film transistor T1. The driving module 7 includes a driving thin-film transistor T2. The storing module 8 includes a storage capacitor C. A gate of the switching thin-film transistor T1 is connected to a scan line Scan, a source of the switching thin-film transistor T1 is connected to a data line Data, and a drain of the switching thin-film transistor T1 is connected to a first capacitor electrode c1 of the storage capacitor C and a gate of the driving thin-film transistor T2. A source of the driving thin-film transistor T2 is connected to the second electrode of the mini-LED M and a drain of the driving thin-film transistor T2 is connected to the VSS signal end. A second capacitor electrode c2 of the storage capacitor is connected to the VSS signal end. The first electrode of the mini-LED M is connected to the VDD signal end. By means of the driving unit constructed by the switching thin-film transistor T1, the driving thin-film transistor T2, the storage capacitor C and various signal ends, the mini-LED M can be driven to emit light, thereby providing a light source for the backlight module. It is noted that herein, the source and the drain of the switching thin-film transistor T1 are interchangeable and the source and the drain of the driving thin-film transistor T2 are interchangeable. For example, the drain of the switching thin-film transistor is connected to the data line Data and the source of the switching thin-film transistor T1 is connected to the first capacitor electrode c1 of the storage capacitor C and the gate of the driving thin-film transistor T2. It is noted that the mini-LED can be indicated by M or 20 in FIG. 3.

As shown in FIGS. 1, 2 and 3, these figures illustrate the thin-film transistor 100 including a source 151 (or 152), a drain 152 (or 151), a gate 121, an active layer 14. The TFT 100 further includes a gate insulating layer disposed between the gate 121 and the active layer 14. Meanwhile, the surfaces of the source 151 (or 152) and the drain 152 (or 151) may be further covered by an insulating interlayer 16. The TFT 100 shown in FIGS. 1 and 2 can be any one of the switching thin-film transistor T1 and the driving thin-film transistor T2 shown in FIG. 3. For example, when the TFT 100 is the driving thin-film transistor T2, the switching thin-film transistor T1 is located at one side of the driving thin-film transistor T2 and this is not shown in the figures. The switching thin-film transistor T1 also includes the source 151 (or 152), the drain 152 (or 151), the gate 121, the active layer 14 and the gate insulating layer 13.

As shown in FIGS. 1, 2 and 3, these figures illustrate the capacitor 200 including a first capacitor electrode 122 (or 153), a second capacitor electrode 153 (or 122) and an insulating layer between the first capacitor electrode 122 (or 153) and the second capacitor electrode 153 (or 122). The capacitor 200 shown in FIGS. 1 and 2 is the storage capacitor C of the circuit shown in FIG. 3. The first capacitor electrode 122 (or 153) in FIGs. 1 and 2 is equivalent to the first capacitor electrode c1 of the circuit shown in FIG. 3. The second capacitor electrode 153 (or 122) in FIGS. 1 and 2 is equivalent to the second capacitor electrode c2 of the circuit shown in FIG. 3. Herein, the insulating layer between the first capacitor electrode 122 (or 153) and the second capacitor electrode 153 (or 122) is the gate insulating layer 13. It is noted that in FIGS. 1 and 2, the first capacitor electrode can be any one of 122 and 153 while the second capacitor electrode is the other one of 122 and 153.

As shown in FIGs. 1, 2 and 3, these figures illustrate the mini-LED, which is indicated by 20 in FIGS. 1 and 2 and can be indicated by M or 20 in FIG. 3.

As shown in FIGS. 1, 2 and 3, the backlight module 1000 further includes contact electrodes 300 including a first contact electrode 123 and a second contact electrode 124.

In the present embodiment, referring to FIGS. 1 and 2, the backlight module 1000 further includes a first metal layer 12, disposed on the glass substrate 11 and including the gate 121 of the driving thin-film transistor 100 (T2); the gate insulating layer 13, disposed on the glass substrate 11 and the first metal layer 12; the active layer 14, disposed on the gate insulating layer 13 and located at one side of the gate 121 of the driving thin-film transistor 100; a second metal layer 15, disposed on the gate insulating layer 13 and the active layer 14, including the source 151 (or 152) and the drain 152 (or 151) of the driving thin-film transistor 100 that are connected to the active layer 14; the insulating interlayer 16, disposed on the second metal layer 15, through holes 161-162 provided in the insulating interlayer 16, wherein the second electrode 22 of the mini-LED 20 is electrically connected to the drain 152 (or 151) of the driving thin-film transistor 100 via the through hole 162. It is noted that it is illustrated by taking the thin-film transistor 100 as the driving thin-film transistor T2. In some embodiments and implementations, the thin-film transistor 100 can also be taken as the switching thin-film transistor T1. The application is not limited to these variations.

In the present embodiment, referring to FIGS. 1, 2 and 3, the first metal layer 12 further includes a plurality of contact electrodes 300. The contact electrodes 300 in each driving unit 80 includes a first contact electrode 123 and a second contact electrode 124. Two ends of the first contact electrode 123 are connected to the VDD signal end and the first electrode 21 of the mini-LED 20 (M), respectively. Two ends of the second contact electrode 124 are connected to the second electrode 22 of the mini-LED 20 (M) and the drain 152 (or 151) of the driving thin-film transistor 100 (T2), respectively. That is, the first electrode 21 of the mini-LED 20 (M) is connected to the VDD signal end via the first contact electrode 123 and the second electrode 22 of the mini-LED 20 (M) is connected to the drain 152 (or 151) of the driving thin-film transistor 100 (T2) via the second contact electrode 124. In the present embodiment, the contact electrodes 300 are formed by the first metal layer 12. The first electrode 21 of the mini-LED 20 (M) is electrically connected to the first contact electrode 123 via a first connection part 31. The second electrode 22 of the mini-LED 20 (M) is electrically connected to the second contact electrode 124 via a second connect part 32. The first connection part 31 and the second connection part 32 can be a solder paste and etc., but are not limited thereto. It is noted that it is illustrated by taking the thin-film transistor 100 as the driving thin-film transistor T2. In some embodiments and implementations, the thin-film transistor 100 can also be taken as the switching thin-film transistor T1. The application is not limited to these variations.

Embodiment 2

Figure 4:
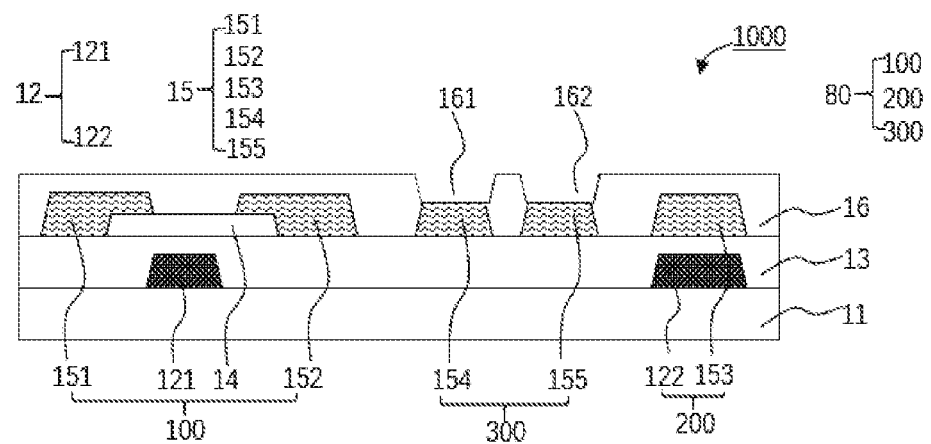
FIG. 4 is a structural schematic diagram illustrating a backlight module according to Embodiment 2 of the present application.
Figure 5:
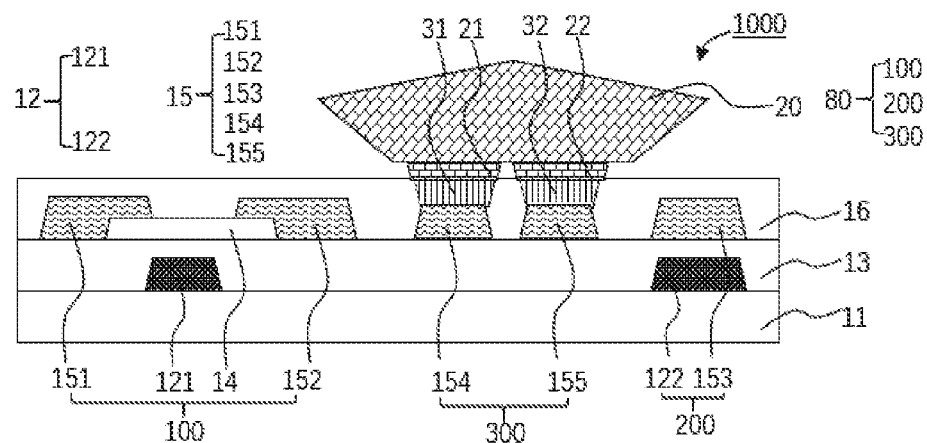
FIG. 5 is a structural schematic diagram illustrating a backlight module according to Embodiment 2 of the present application.

In the present embodiment, referring to FIGS. 3, 4 and 5, the difference to the Embodiment 1 is that the contact electrodes 300 are manufactured using the second metal layer 15.

Specifically, the second metal layer 15 further includes a plurality of contact electrodes 300. The contact electrodes 300 in each driving unit 80 includes a first contact electrode 154 and a second contact electrode 155. Two ends of the first contact electrode 154 are connected to the VDD signal end and the first electrode 21 of the mini-LED 20 (M), respectively. Two ends of the second contact electrode 155 are connected to the second electrode 22 of the mini-LED 20 (M) and the drain 152 (or 151) of the driving thin-film transistor 100 (T2), respectively. That is, the first electrode 21 of the mini-LED 20 (M) is connected to the VDD signal end via the first contact electrode 154 and the second electrode 22 of the mini-LED 20 (M) is connected to the drain 152 (or 151) of the driving thin-film transistor 100 (T2) via the second contact electrode 155. In the present embodiment, the contact electrodes 300 are formed by the second metal layer 15. The first electrode 21 of the mini-LED 20 (M) is electrically connected to the first contact electrode 154 via a first connection part 31. The second electrode 22 of the mini-LED 20 (M) is electrically connected to the second contact electrode 155 via a second connect part 32. The first connection part 31 and the second connection part 32 can be a solder paste and etc., but are not limited thereto. It is noted that it is illustrated by taking the thin-film transistor 100 as the driving thin-film transistor T2. In some embodiments and implementations, the thin-film transistor 100 can also be taken as the switching thin-film transistor T1. The application is not limited to these variations.

Embodiment 3

Figure 6:
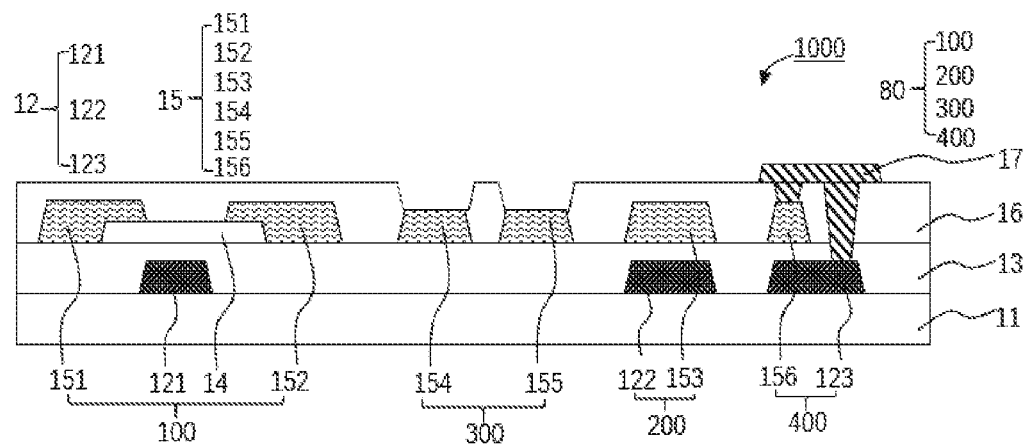
FIG. 6 is a structural schematic diagram illustrating a backlight module according to Embodiment 3 of the present application.
Figure 7:
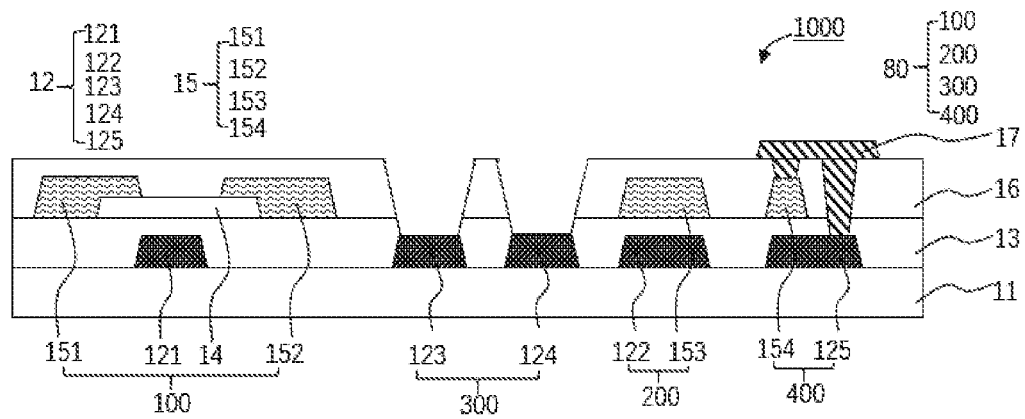
FIG. 7 is a structural schematic diagram illustrating a backlight module according to Embodiment 3 of the present application.

In the present embodiment, referring to FIGS. 3, 6 and 7, the difference to Embodiments 1 and 2 is that an indium tin oxide (ITO) layer is disposed on the insulating interlayer 16.

In the present embodiment, referring to FIGS. 6 and 7, a backlight module 1000 includes a glass substrate 11; a plurality of driving units 80, formed on the glass substrate 11, each of the driving units 80 includes a thin-film transistor 100; and a plurality of mini-LEDs 20, disposed on the glass substrate 11, each of the mini-LEDs 20 includes a first electrode 21 and a second electrode 22 that are connected to a corresponding driving unit 80. By manufacturing the driving units 80 including the TFTs 100 on the glass substrate to drive the mini-LEDs, the thickness of a mini-LED backlight module and a display panel can be reduced and the cost is lowered.

As shown in FIGS. 3, 6 and 7, these figures illustrate the thin-film transistor 100 including a source 151 (or 152), a drain 152 (or 151), a gate 121, an active layer 14. The TFT 100 further includes a gate insulating layer disposed between the gate 121 and the active layer 14. Meanwhile, the surfaces of the source 151 (or 152) and the drain 152 (or 151) may be further covered by an insulating interlayer 16. The TFT 100 shown in FIGS. 1 and 2 can be any one of the switching thin-film transistor T1 and the driving thin-film transistor T2 shown in FIG. 3. For example, when the TFT 100 is the driving thin-film transistor T2, the switching thin-film transistor T1 is located at one side of the driving thin-film transistor T2 and this is not shown in the figures. The switching thin-film transistor T1 also includes the source 151 (or 152), the drain 152 (or 151), the gate 121, the active layer 14 and the gate insulating layer 13.

Figure 8:
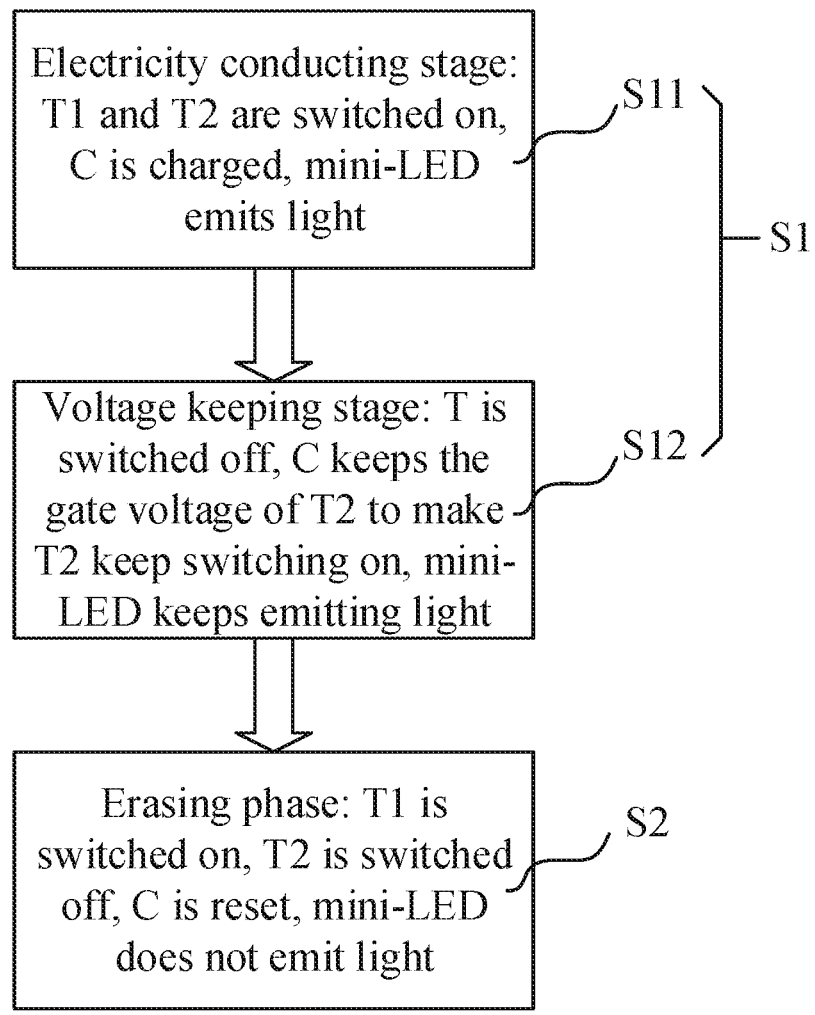
FIG. 8 is a flowchart of a work process of a backlight module according to Embodiment 4 of the present application.

As shown in FIGS. 3, 6 and 7, these figures illustrate the capacitor 200 including a first capacitor electrode 122 (or 153), a second capacitor electrode 153 (or 122) and an insulating layer between the first capacitor electrode 122 (or 153) and the second capacitor electrode 153 (or 122). The capacitor 200 shown in FIGs. 6 and 7 is the storage capacitor C of the circuit shown in FIG. 3. The first capacitor electrode 122 (or 153) in FIGs. 6 and 7 is equivalent to the first capacitor electrode c1 of the circuit shown in FIG. 3. The second capacitor electrode 153 (or 122) in FIGS. 7 and 8 is equivalent to the second capacitor electrode c2 of the circuit shown in FIG. 3. Herein, the insulating layer between the first capacitor electrode 122 (or 153) and the second capacitor electrode 153 (or 122) is the gate insulating layer 13. It is noted that in FIGS. 6 and 7, the first capacitor electrode can be any one of 122 and 153 while the second capacitor electrode is the other one of 122 and 153.

As shown in FIGs. 3, 6 and 7, the backlight module 1000 further includes contact electrodes 300 including a first contact electrode 123 and a second contact electrode 124. Alternatively, the contact electrodes 300 include a first contact electrode 154 and a second contact electrode 155.

In the present embodiment, referring to FIGS. 6 and 7, the backlight module 1000 further includes a first metal layer 12, disposed on the glass substrate 11 and including the gate 121 of the driving thin-film transistor 100 (T2); the gate insulating layer 13, disposed on the glass substrate 11 and the first metal layer 12; the active layer 14, disposed on the gate insulating layer 13 and located at one side of the gate 121 of the driving thin-film transistor 100; a second metal layer 15, disposed on the gate insulating layer 13 and the active layer 14, including the source 151 (or 152) and the drain 152 (or 151) of the driving thin-film transistor 100 that are connected to the active layer 14; the insulating interlayer 16, disposed on the second metal layer 15, through holes 161-162 provided in the insulating interlayer 16, wherein the second electrode 22 of the mini-LED 20 is electrically connected to the drain 152 (or 151) of the driving thin-film transistor 100 via the through hole 162; the ITO layer 17, disposed on the insulating interlayer 16, wherein the ITO layer 16 can serve as a connection electrode connecting the trances or electrodes on the first metal layer 12 and the second metal layer 15, and for example, the data line Data or a VDD signal line includes a first sub part 125 of the first metal layer 12 and a second sub part 154 of the second metal layer 15, the ITO layer 17 can serve as a connection electrode connecting the first sub part 125 of the first metal layer 12 and the second sub part 154 of the second metal layer 15 by passing through the through holes in the insulating interlayer 16 for reducing the resistance of the data line Data or the VDD signal line. It is noted that it is illustrated by taking the thin-film transistor 100 as the driving thin-film transistor T2. In some embodiments and implementations, the thin-film transistor 100 can also be taken as the switching thin-film transistor T1. The application is not limited to these variations.

Based on Embodiments 1, 2 and 3, the first metal layer 12 and/or the second metal layer 15 can be made of copper (Cu). The active layer 14 is amorphous silicon (a-Si), but is not limited thereto. For example, the first metal layer 12 or the second metal layer 15 is Mo/AL/Mo, and the active layer is indium gallium zinc oxide (IGZO) and etc.

Based on Embodiments 1, 2 and 3, the structure of the thin-film transistor 100 is not limited to a bottom-gate structure, and it can also be a top-gate structure or a lateral-gate structure, but is not limited thereto.

Based on Embodiments 1, 2 and 3, the first metal layer 12 further includes the first capacitor electrode 122 (any of c1 and c2) of the storage capacitor 200 (C) and the second metal layer 15 further includes the second capacitor electrode 153 (any of c1 and c2) of the storage capacitor 200 (C).

Based on Embodiments 1, 2 and 3, the backlight module may further selectively include scan lines Scan for providing scan signals to the driving units, selectively include data lines Data for providing data signals to the driving units, selectively include VDD traces for providing VDD signals to the driving units or serving as the VDD signal end, and selectively include VSS trances for providing VSS signals to the driving units or serving as the VSS signal end. The scan lines Scan, the data lines Data, the VDD traces or the VDD signal end, and the VSS traces or the VSS signal end may selectively be manufactured using any of or both of the first metal layer 12 and the second metal layer 15, but is not limited thereto.

Based on Embodiments 1, 2 and 3, the storage capacitor 200 (C) can use the first metal layer 12 and the second metal layer 15 to form the first capacitor electrode (c1) and the second capacitor electrode (c2).

Embodiment 4

Based on above embodiments, work processes and principles of the backlight module will be illustrated below.

In the present embodiment, FIG. 3 is a diagram illustrating a circuit of driving mini-LEDs of the backlight module in above embodiments and FIG. 8 is a flowchart of a process of driving the mini-LEDs to emit light using the circuit shown in FIG. 3.

FIG. 3 illustrates a circuit structure diagram of the present embodiment. Each driving unit 80 includes a switching module 6, a driving module 7 and a storing module 8. One end of the switching module 6 is connected to the driving module and the storing module 8. The driving module 7 is connected to the mini-LED 20. Specifically, each driving unit 80 further includes a VDD signal end and a VSS signal end. The switching module 6 includes a switching thin-film transistor T1. The driving module 7 includes a driving thin-film transistor T2. The storing module 8 includes a storage capacitor C. A gate of the switching thin-film transistor T1 is connected to a scan line Scan, a source of the switching thin-film transistor T1 is connected to a data line Data, and a drain of the switching thin-film transistor T1 is connected to a first capacitor electrode c1 of the storage capacitor C and a gate of the driving thin-film transistor T2. A source of the driving thin-film transistor T2 is connected to the second electrode of the mini-LED M and a drain of the driving thin-film transistor T2 is connected to the VSS signal end. A second capacitor electrode c2 of the storage capacitor is connected to the VSS signal end. The first electrode of the mini-LED M is connected to the VDD signal end. By means of the unit constructed by the thin-film transistor and the capacitor, the mini-LED M can be driven to emit light, thereby providing a light source for the backlight module. It is noted that herein, the source and the drain of the switching thin-film transistor T1 are interchangeable and the source and the drain of the driving thin-film transistor T2 are interchangeable. For example, the drain of the switching thin-film transistor is connected to the data line Data and the source of the switching thin-film transistor T1 is connected to the first capacitor electrode c1 of the storage capacitor C and the gate of the driving thin-film transistor T2. It is noted that FIG. 3 illustrates the mini-LED, which can be indicated by M or 20 as shown in FIG. 3. Operations of the backlight module 1000 are divided into a light emitting phase S1 and an erasing phase S2. For example, it alternates the light emitting phase S1 and the erasing phase S2 when the mini-LEDs M function. At the light emitting phase S1, the mini-LEDs M emit light. At the erasing phase S2, the mini-LEDs M does not emit light.

Specifically, the light emitting phase S1 may include an electricity conducting stage S11 and a voltage keeping stage S12. At the electricity conducting stage S11, the mini-LEDs M start to work to emit light after signals are inputted to the driving units. At the voltage keeping stage S12, the mini-LEDs M keeps working to emit light by means of the storage capacitor C.

Specifically, at the electricity conducting stage S11 of the light emitting phase S1, the switching thin-film transistor T1 and the driving thin-film transistor T2 are switched on, the switched-on driving thin-film transistor T2 makes a signal of the VDD signal end drive the mini-LED M to emit light, and at the voltage keeping stage S12 of the light emitting phase S1, the switching thin-film transistor T1 is switched off, the storage capacitor C keeps the driving thin-film transistor T2 switched on and keeps the mini-LED M emitting light.

At the erasing phase S2, the switching thin-film transistor T1 is switched on, a signal of the data line Data is transmitted to the first capacitor electrode c1 of the storage capacitor C and the gate of the driving thin-film transistor T2 via the switching thin-film transistor T1 and meanwhile, the switching thin-film transistor T2 is switched off and the storage capacitor C is reset. The mini-LED M is not operated and does not emit light.

The work processes of the backlight module will be described in a further step below in some embodiments and implementations, the VDD signal end is always supplied by high voltage level (e.g., 20V) and the VSS signal end is always supplied by low voltage level (e.g., 0V). The work processes of the backlight module are primarily divided into two phases, i.e., the light emitting phase and the erasing phase S2. The work processes of the backlight module are implemented as below. The scan line Scan and the data line Data are simultaneously supplied by corresponding high voltage levels and meanwhile, the switching thin-film transistor T1 is switched on such that the high voltage level of the data line Data is written to Point A (Point A is electrically connected to the drain of the switching thin-film transistor T1, the gate of the driving thin-film transistor T2 and the first capacitor electrode c1 of the storage capacitor C). Because Point A is of high voltage level, the driving thin-film transistor T2 is switched on, the mini-LED M is conducted. Accordingly, the mini-LED M can emit light. After that, the scan line Scan and the data line Data are switched off Since there is a storage capacitor C between Point A and the VSS signal end, the potential of Point A is kept so as to keep the driving thin-film transistor T2 switched on. The mini-LED M continues to emit light. At the erasing phase S2, the signal of the scan line Scan is supplied by a corresponding high voltage level and the signal of the data line Data is supplied by a corresponding low voltage level. In such a way, Point A is written by the low voltage level and the switching thin-film transistor T1 is switched off. The loop of the mini-LED M haves no current and the mini-LED M is erased. That is, the mini-LED M does not emit light.

Based on above embodiments, it is noted that the source and the drain of the thin-film transistor are interchangeable. For example, in the circuit structure diagram shown in FIG. 3, each driving unit includes the thin-film transistors, the storage capacitor C, the VDD signal end, the VSS signal end, the scan line Scan and the data line Data. The thin-film transistors include the switching thin-film transistor T1 and the driving thin-film transistor T2. The gate of the switching thin-film transistor T1 is connected to the scan line Scan, the drain of the switching thin-film transistor T1 is connected to the data line Data, and the source of the switching thin-film transistor T1 is connected to the first capacitor electrode c1 of the storage capacitor C and the gate of the driving thin-film transistor T2. The drain of the driving thin-film transistor T2 is connected to the second electrode of the mini-LED M and the source of the driving thin-film transistor T2 is connected to the VSS signal end. The second capacitor electrode c2 of the storage capacitor is connected to the VSS signal end. The first electrode of the mini-LED M is connected to the VDD signal end. By means of the unit constructed by the thin-film transistor and the capacitor, the mini-LED M can be driven to emit light, thereby providing a light source for the backlight module.

Based on above embodiments, it is noted that switch voltage signals of the switching thin-film transistor T1 and the driving thin-film transistor T2 are determined by the types and properties of the active layers semiconductor layers) in the switching thin-film transistor T1 and the driving thin-film transistor T2. In some embodiments, when the gate voltages of the two are at high voltage level, the switching thin-film transistor T1 and the driving thin-film transistor T2 are switched on; when the gate voltages of the two are at low voltage level, the switching thin-film transistor T1 and the driving thin-film transistor T2 are switched off. In some embodiments, when the gate voltages of the two are at low voltage level, the switching thin-film transistor T1 and the driving thin-film transistor T2 are switched on; when the gate voltages of the two are at high voltage level, the switching thin-film transistor T1 and the driving thin-film transistor T2 are switched off.

Embodiment 5

Figure 9:
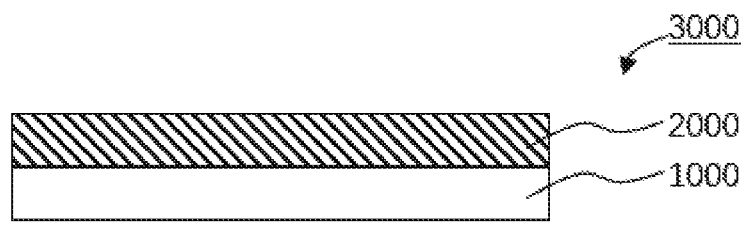
FIG. 9 is a structural schematic diagram illustrating a display panel according to Embodiment 5 of the present application.

In the present embodiment, referring to FIG. 9, the present application further provides a display panel 3000, which includes the backlight module 1000 according to any of above embodiments. For example, as shown in FIG. 9, a liquid crystal cell 2000 is disposed on the backlight module 1000, which provides a light source for the display panel 3000 to display images.

Figure 10:
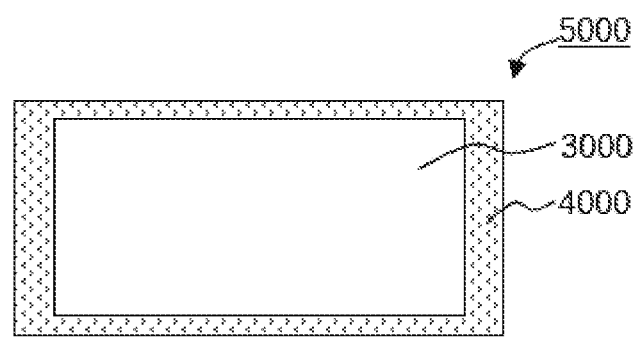
FIG. 10 is a structural schematic diagram illustrating an electronic device provided in the present application.

Referring to FIG. 10, the present application further provides an electronic device 5000, which includes the aforesaid display panel 3000. The electronic device 5000 may be a television, a computer and etc., but is not limited thereto. The electronic device 5000 may further include other parts 4000 such as a housing.

In the above embodiments, different emphasis is placed on respective embodiments, and reference may be made to related depictions in other embodiments for portions not detailed in a certain embodiment.

Hereinbefore, the display panel and the display device provided in the embodiments of the present application are introduced in detail, the principles and implementations of the present application are set forth herein with reference to specific examples, descriptions of the above embodiments are merely served to assist in understanding the technical solutions and essential ideas of the present application. Those having ordinary skill in the art should understand that they still can modify technical solutions recited in the aforesaid embodiments or equivalently replace partial technical features therein; these modifications or substitutions do not make essence of corresponding technical solutions depart from the spirit and scope of technical solutions of embodiments of the present application.

The invention claimed is:

1. A backlight module, comprising:
a glass substrate;
a plurality of driving units, formed on the glass substrate, each of the driving units comprises a thin-film transistor;
a plurality of mini light-emitting diodes (mini-LEDs), disposed on the glass substrate, each of the mini-LEDs comprises a first electrode and a second electrode that are connected to a corresponding driving unit, wherein the driving unit comprises a switching module, a driving module and a storing module, one end of the switching module is connected to the driving module and the storing module, the driving module is connected to the mini-LED, and wherein the driving module comprises a driving thin-film transistor;
a first metal layer, disposed on the glass substrate, comprising a gate of the driving thin-film transistor;
a gate insulating layer, disposed on the glass substrate and the first metal layer;
a second metal layer, disposed on the gate insulating layer, comprising a source and a drain of the driving thin-film transistor; and
a plurality of contact electrodes, formed by the first metal layer or by the second metal layer, wherein the contact electrodes in each of the driving units comprises a first contact electrode and a second contact electrode, and the first contact electrode is connected to the first electrode of the mini-LED, and the second contact electrode is connected to the second electrode of the mini-LED.

2. The backlight module according to claim 1, wherein each of the driving units further comprises a VDD signal end and a VSS signal end, the switching module comprises a switching thin-film transistor, the storing module comprises a storage capacitor, a gate of the switching thin-film transistor is connected to a scan line, a source of the switching thin-film transistor is connected to a data line, a drain of the switching thin-film transistor is connected to a first capacitor electrode of the storage capacitor and the gate of the driving thin-film transistor, the source of the driving thin-film transistor is connected to the second electrode of the mini-LED, the drain of the driving thin-film transistor is connected to the VSS signal end, a second capacitor electrode of the storage capacitor is connected to the VSS signal end, the first electrode of the mini-LED is connected to the VDD signal end.

3. The backlight module according to claim 2, further comprising:
an active layer, disposed on the gate insulating layer and located at one side of the gate of the driving thin-film transistor,
wherein the source and the drain of the driving thin-film transistor are connected to the active layer;
an insulating interlayer, disposed on the second metal layer, a through hole provided in the insulating interlayer, wherein the second electrode of the mini-LED is electrically connected to the drain of the driving thin-film transistor via the through hole.

4. The backlight module according to claim 3, wherein two ends of the first contact electrode are connected to the VDD signal end and the first electrode of the mini-LED respectively, and two ends of the second contact electrode are connected to the second electrode of the mini-LED and the drain of the driving thin-film transistor respectively.

5. The backlight module according to claim 4, wherein the first metal layer or the second metal layer is copper and the active layer is amorphous silicon (a-Si).

6. The backlight module according to claim 3, wherein the first metal layer further comprises the first capacitor electrode of the storage capacitor and the second metal layer further comprises the second capacitor electrode of the storage capacitor.

7. The backlight module according to claim 6, wherein a signal of the VDD signal end is at high voltage level and a signal of the VSS signal end is at low voltage level.

8. The backlight module according to claim 2, wherein at an electricity conducting stage of a light emitting phase, the switching thin-film transistor and the driving thin-film transistor are switched on, the switched-on driving thin-film transistor makes a signal of the VDD signal end drive the mini-LED to emit light, and at a voltage keeping stage of the light emitting phase, the switching thin-film transistor is switched off, the storage capacitor keeps the driving thin-film transistor switched on and keeps the mini-LED emitting light; and
wherein at an erasing phase, the switching thin-film transistor is switched on, a signal of the data line is transmitted to the first capacitor electrode of the storage capacitor and the gate of the driving thin-film transistor via the switching thin-film transistor and meanwhile, the switching thin-film transistor is switched off and the storage capacitor is reset.

9. A display panel, comprising a backlight module comprising:
a glass substrate;
a plurality of driving units, formed on the glass substrate, each of the driving units comprises a thin-film transistor;
a plurality of mini light-emitting diodes (mini-LEDs), disposed on the glass substrate, each of the mini-LEDs comprises a first electrode and a second electrode that are connected to a corresponding driving unit, wherein the driving unit comprises a switching module, a driving module and a storing module, one end of the switching module is connected to the driving module and the storing module, the driving module is connected to the mini-LED, and wherein the driving module comprises a driving thin-film transistor;

a first metal layer, disposed on the glass substrate, comprising a gate of the driving thin-film transistor;

a gate insulating layer, disposed on the glass substrate and the first metal layer;

a second metal layer, disposed on the gate insulating layer, comprising a source and a drain of the driving thin-film transistor; and a plurality of contact electrodes, formed by the first metal layer or by the second metal layer, wherein the contact electrodes in each of the driving units comprises a first contact electrode and a second contact electrode, and the first contact electrode is connected to the first electrode of the mini-LED, and the second contact electrode is connected to the second electrode of the mini-LED.

10. The display panel according to claim 9, wherein each of the driving units further comprises a VDD signal end and a VSS signal end, the switching module comprises a switching thin-film transistor, the storing module comprises a storage capacitor, a gate of the switching thin-film transistor is connected to a scan line, a source of the switching thin-film transistor is connected to a data line, a drain of the switching thin-film transistor is connected to a first capacitor electrode of the storage capacitor and the gate of the driving thin-film transistor, the source of the driving thin-film transistor is connected to the second electrode of the mini-LED, the drain of the driving thin-film transistor is connected to the VSS signal end, a second capacitor electrode of the storage capacitor is connected to the VSS signal end, the first electrode of the mini-LED is connected to the VDD signal end.

11. The display panel according to claim 10, further comprising:

an active layer, disposed on the gate insulating layer and located at one side of the gate of the driving thin-film transistor, wherein the source and the drain of the driving thin-film transistor are connected to the active layer;

an insulating interlayer, disposed on the second metal layer, a through hole provided in the insulating interlayer, wherein the second electrode of the mini-LED is electrically connected to the drain of the driving thin-film transistor via the through hole.

12. The display panel according to claim 11, wherein two ends of the first contact electrode are connected to the VDD signal end and the first electrode of the mini-LED respectively, and two ends of the second contact electrode are connected to the second electrode of the mini-LED and the drain of the driving thin-film transistor respectively.

13. The display panel according to claim 12, wherein the first metal layer or the second metal layer is copper and the active layer is amorphous silicon (a-Si).

14. The display panel according to claim 11, wherein the first metal layer further comprises the first capacitor electrode of the storage capacitor and the second metal layer further comprises the second capacitor electrode of the storage capacitor.

15. An electronic device, comprising a display panel, which comprises a backlight module comprising:

a glass substrate;

a plurality of driving units, formed on the glass substrate, each of the driving units comprises a thin-film transistor;

a plurality of mini light-emitting diodes (mini-LEDs), disposed on the glass substrate, each of the mini-LEDs comprises a first electrode and a second electrode that are connected to a corresponding driving unit, wherein the driving unit comprises a switching module, a driving module and a storing module, one end of the switching module is connected to the driving module and the storing module, the driving module is connected to the mini-LED, and wherein the driving module comprises a driving thin-film transistor;

a first metal layer, disposed on the glass substrate, comprising a gate of the driving thin-film transistor;

a gate insulating layer, disposed on the glass substrate and the first metal layer;

a second metal layer, disposed on the gate insulating layer, comprising a source and a drain of the driving thin-film transistor; and a plurality of contact electrodes, formed by the first metal layer or by the second metal layer, wherein the contact electrodes in each of the driving units comprises a first contact electrode and a second contact electrode, and the first contact electrode is connected to the first electrode of the mini-LED, and the second contact electrode is connected to the second electrode of the mini-LED.

16. The electronic device according to claim 15, wherein each of the driving units further comprises a VDD signal end and a VSS signal end, the switching module comprises a switching thin-film transistor, the storing module comprises a storage capacitor, a gate of the switching thin-film transistor is connected to a scan line, a source of the switching thin-film transistor is connected to a data line, a drain of the switching thin-film transistor is connected to a first capacitor electrode of the storage capacitor and the gate of the driving thin-film transistor, the source of the driving thin-film transistor is connected to the second electrode of the mini-LED, the drain of the driving thin-film transistor is connected to the VSS signal end, a second capacitor electrode of the storage capacitor is connected to the VSS signal end, the first electrode of the mini-LED is connected to the VDD signal end.

17. The electronic device according to claim 16, further comprising:

an active layer, disposed on the gate insulating layer and located at one side of the gate of the driving thin-film transistor, wherein the source and the drain of the driving thin-film transistor are connected to the active layer;

an insulating interlayer, disposed on the second metal layer, a through hole provided in the insulating interlayer, wherein the second electrode of the mini-LED is electrically connected to the drain of the driving thin-film transistor via the through hole.

18. The electronic device according to claim 17, wherein two ends of the first contact electrode are connected to the VDD signal end and the first electrode of the mini-LED respectively, and two ends of the second contact electrode are connected to the second electrode of the mini-LED and the drain of the driving thin-film transistor respectively.

19. The electronic device according to claim 18, wherein the first metal layer or the second metal layer is copper and the active layer is amorphous silicon (a-Si).

20. The electronic device according to claim 17, wherein the first metal layer further comprises the first capacitor electrode of the storage capacitor and the second metal layer further comprises the second capacitor electrode of the storage capacitor.

\* \* \* \* \*